(12) United States Patent
Fritzsche

(10) Patent No.: US 6,413,437 B1
(45) Date of Patent: Jul. 2, 2002

(54) FINE FEATURED PHOTO-RESIST ARTWORK DESIGN FOR CHEMICAL MILLING

(75) Inventor: Robert M. Fritzsche, Attleboro Falls, MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/325,319

(22) Filed: Jun. 3, 1999

Related U.S. Application Data

(60) Provisional application No. 60/088,480, filed on Jun. 8, 1998.

(51) Int. Cl.[7] .................................................. B44C 1/22
(52) U.S. Cl. .......................... 216/28; 216/32; 216/41; 216/96; 216/97; 216/100
(58) Field of Search .............................. 216/32, 28, 41, 216/96, 97, 100

(56) References Cited

U.S. PATENT DOCUMENTS 3,653,898 A  *  4/1972  Shaw .............................. 96/35
3,942,981 A  *  3/1976  Sato ............................... 96/36
5,426,007 A  *  6/1995  Ogoshi ............................ 430/5

FOREIGN PATENT DOCUMENTS

JP          63210284     *  8/1988  ............. C23F/1/00

* cited by examiner

Primary Examiner—Randy Gulakowski
Assistant Examiner—M. Kornakov
(74) Attorney, Agent, or Firm—David Denker; Robby T. Holland; Frederick J. Telecky, Jr.

(57) ABSTRACT

The invention is a method of forming the art work for chemically etching that produces uniform through-etch and lateral-etch. The artwork that defines the pattern to be etched utilizes lines equal to the narrowest feature that is to be etched. Rather than etch away large areas, section are removed by etching by cutting them out of the material that is being etched. The artwork or pattern is designed with the same compensation factors throughout the entire pattern and the etch rate will be completely uniform for the entire pattern.

22 Claims, 4 Drawing Sheets

FINE FEATURED PHOTO-RESIST ARTWORK DESIGN FOR CHEMICAL MILLING

This application claims priority under 35 USC §119(e)(1) of provisional application No. 60/088,480 filed Jun. 08, 1998.

FIELD OF THE INVENTION

The invention relates to chemical etching, and more particularly to a method of forming the art work for chemically etching that produces uniform through-etch and lateral-etch.

BACKGROUND OF THE INVENTION

Etching of metal sheets to form lead frames and other metallic articles with closely spaced members is accomplished by defining apertures in a photo resist material on either one or both sides of a metal sheet. Chemical etching is performed through the apertures to remove metal from the metal sheet to form a desired pattern or design. The chemical etching may be from one or both sides of the metal sheet. When chemical etching is done from both sides, the openings in the photo resist material coating the metal sheet are positioned so that the openings on each side of the metal sheet are aligned with each other. The chemical milling or etching of intricate patterns found in semiconductor lead frames is extremely dependent upon precise and accurate photo mask artwork.

In the etching process, it would be desirable if the etching chemical would only etch vertically through the metal sheet. However, horizontal etching occurs during the etch process. To allow for the horizontal etching, known as undercutting, the photo resist mask is designed to compensate for the undercutting. The degree to which lateral etching, or undercutting, occurs in relation to veritcal etching is influenced in part by the size and geometry of the individual features of the pattern to be etched.

Typical practice is to determine the varying etch rates, both through-etch and lateral-etch, through trial and error, or utilize data bases established from experience to design the photo mask artwork corresponding to a desired part design.

The formation of small dimensioned apertures for photo chemical masking and etching is described in U.S. Pat. No. 3,653,898. Other photo mask processing is described in U.S. Pat. Nos. 5,426,007 and 3,942,981.

SUMMARY OF THE INVENTION

The invention is a method of forming the art work for chemically etching that produces uniform through-etch and lateral-etch. The artwork that defines the pattern to be etched utilizes lines equal to the narrowest feature that is to be etched. Rather than etch away large areas, section are removed by etching by cutting them out of the material that is being etched. The artwork or pattern is designed with the same compensation factors throughout the entire pattern and the etch rate will be completely uniform for the entire pattern.

DESCRIPTION OF A PREFERRED EMBODIMENT

For extremely fine features, for example less than 5 mils wide, in thin substrates, for example less than 12 mils thick, the etch rate for both through-etch and lateral-etch varies significantly from that of features with larger sizes and varying geometries. This variation is influenced by several factors and interactions such as etch chemistry, temperature, pressure, viscosity and flow of the etchant was well as equipment such a nozzle configuration and angle. This variation in etch rates can lead to difficulty in maintaining dimensional control of several different features of varying size and geometry in a given pattern.

Figure 1:
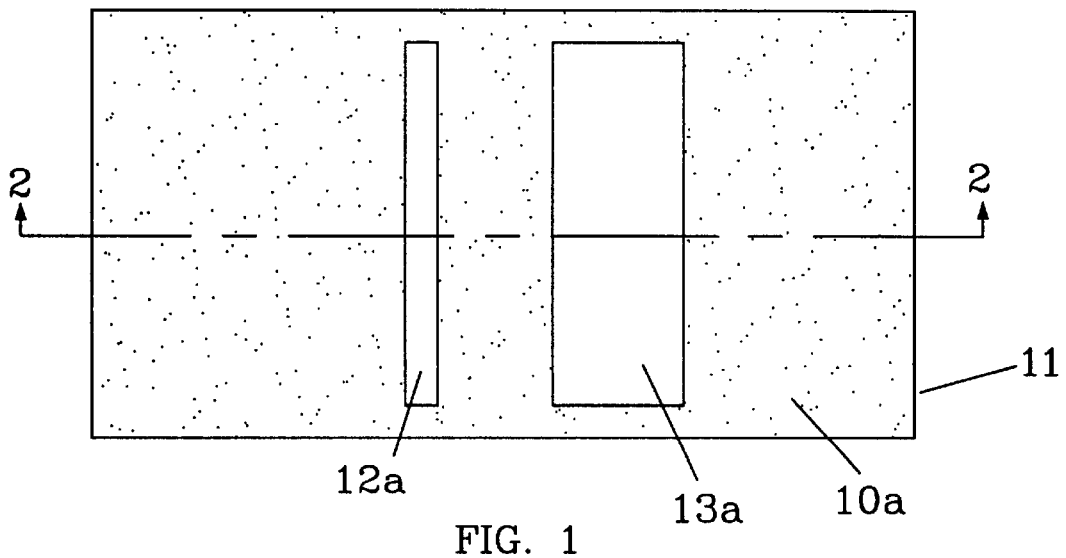
FIGS. 1–4 show a prior art chemical milling process for etching different size openings.
Figure 2:
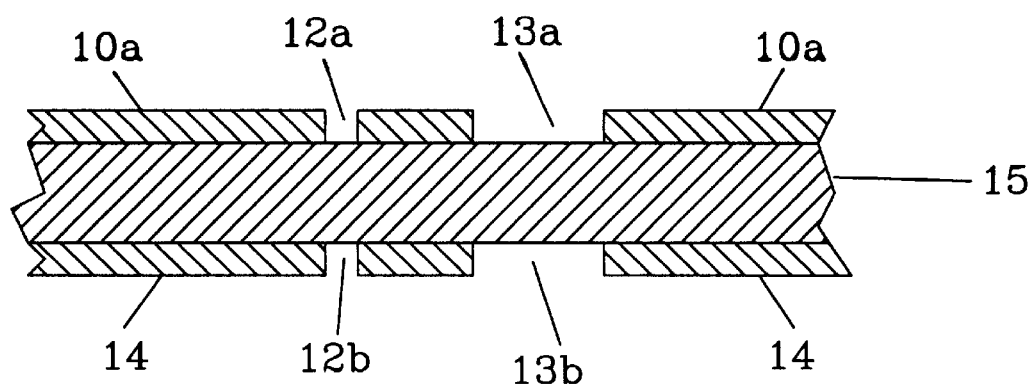
Figure 3:
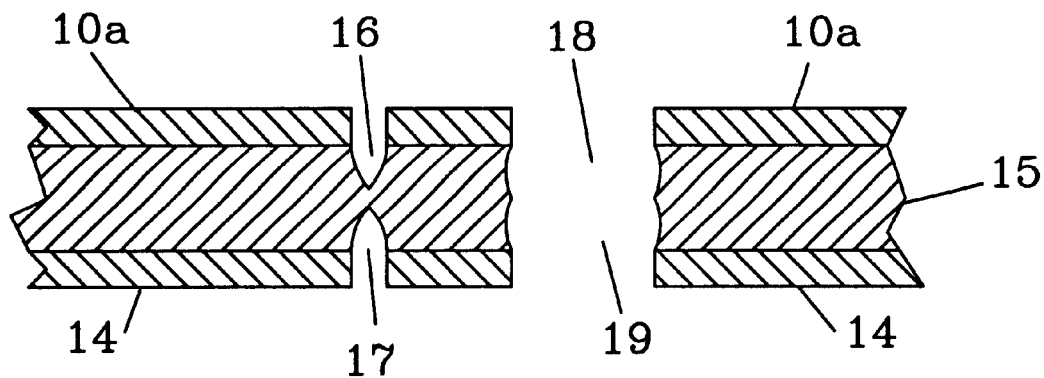
Figure 4:
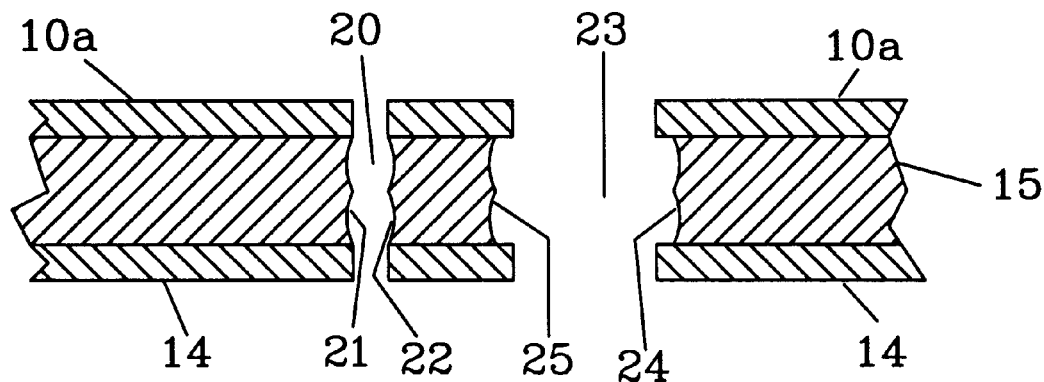

FIGS. 1–4 show an example of an etch process in which two areas of different sizes are etched. In FIG. 1 is shown a sheet of material 11 in which a photo resist material 10a is applied over the surface of the material except in the areas 12a and 13a, which are to be etched. FIGS. 2–4 are cross sectional views, taken through section 2—2 of FIG. 1, with FIG. 2 showing the material before it is etched, FIG. 3 showing partial etching, and FIG. 4 shows complete etching. In FIG. 2, the material 15 is coated on each side with a photo resist material 10a on the top side and 14 on the bottom side. Openings 12a and 13a are shown in photo resist 10a and openings 12b and 13b are shown in the photo resist 14.

In FIG. 3 the material 15 has been etched though openings 12a and 13b to creating etched areas 16 and 17, respectively. The etching in openings 13a and 13b have etched completely through material 15. Since etching continues until etching is complete through openings 12a and 12b, there will be continued etching in openings 13a and 13b.

Figure 5:
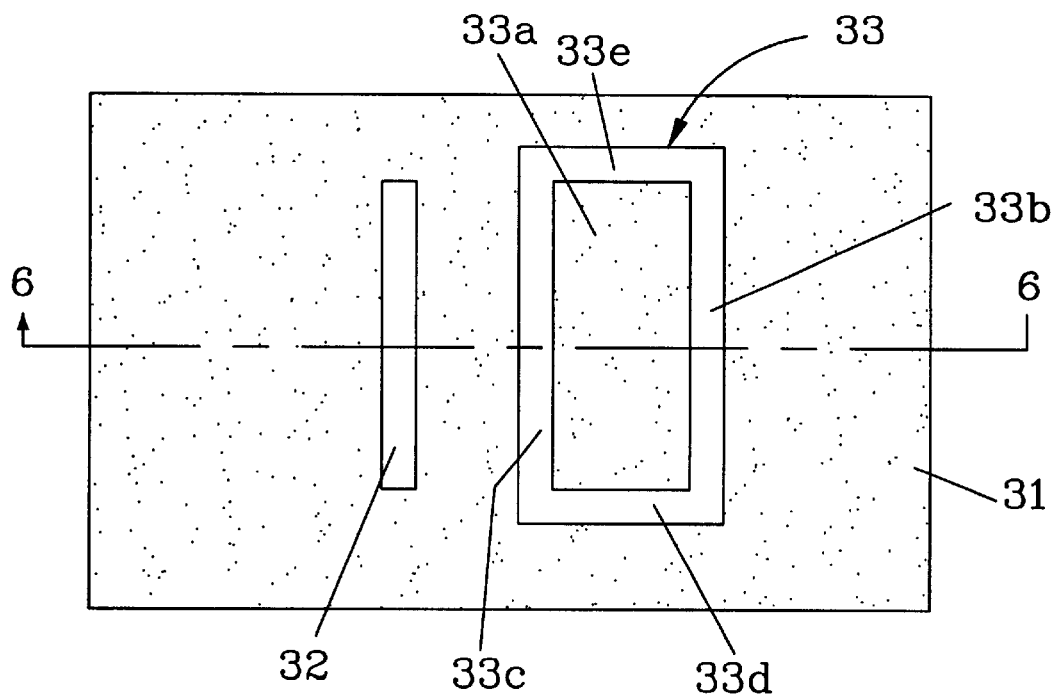
FIGS. 5–9 show a photo-resist design for milling different size openings-according to the present invention.

FIGS. 5–9 show the process according to the present invention in which a larger opening 33a, defined by openings 33b–33e. The openings 33b–33e are openings equal to the narrowest feature to be etched so that all etched areas are the same. FIG. 5 shows the material 36 (FIG. 6) that is to be etched. FIG. 5 shows a plan view of a layer of photo resist 31 on one side of material 36. Openings 32 and 33b–33e are of the same width with opening 32 defining a linear opening and openings 33b–33e enclosing a resist covered area 33a that is to be removed.

FIGS. 5–9 show the process according to the present invention in which a larger opening 33a, defined by openings 33b–33e. The openings 33b–33e are openings equal to the narrowest feature to be etched so that all etched areas are the same. FIG. 5 shows the material 36 (FIG. 6) that is to be etched has a layer of photo resist 31 on one side. Openings 32 and 33b–33e are of the same width with opening 32 defining a linear opening and openings 33b–33e enclosing a resist covered area 33a that is to be removed.

Thus, FIG. 5 shows a uniform width channel 32 defining a first linear area having a first width. FIG. 5 also shows a second area 33 with second area 33 having a second width wider than the uniform width channel 32. Channels 33b, 33c, 33d, and 33e are formed completely around second area 33, leaving an enclosed area 33a.

In the case where the photo-resist mask is designed to compensate for undercutting (as described above), the uniform width channel 32 will be adjusted by a compensation factor. In is case, the uniform width channel 32 will have a third width, which reflects the first width, as adjusted by the compensation factor. However, since this invention allows the compensation factors to be the same throughout the entire pattern, the channels for the first linear area and the second area 33 may both have this third width.

Figure 6:
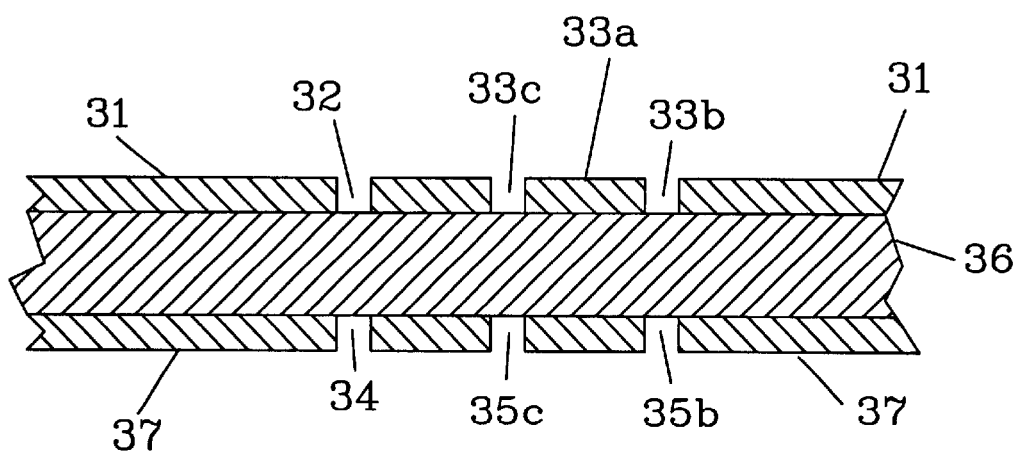

FIGS. 6–9 are cross sectional views taken through section 6—6 of FIG. 5. FIG. 6 shows material 36 with photo resist material 31 on the top side of material 36 and photo resist material 37 on the bottom side of material 36. The openings in the photo resist material 31 form the openings 32, 33b and 33c. On the bottom side of material 36, the corresponding openings are 34, 35b and 35c.

Figure 7:
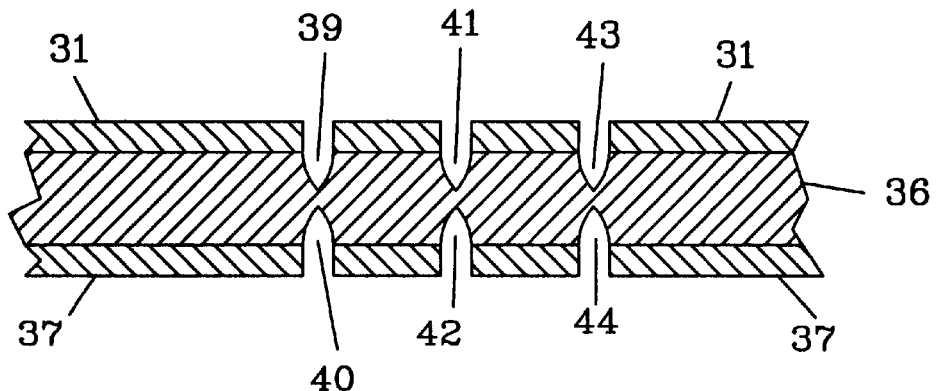

FIG. 7 shows material 36 partially etched through with the etched areas being 39, 40, 41, 42, 43 and 44. Since etching is from both sides and the etch areas are of uniform width. Since the openings 32 and 34, 33b and 35b, and 33c and 35c, are of the same width, the etched areas 39–44 are of the same respective depth into material 36. Vertical-etch and lateral-etch are the same for all openings.

Figure 8:
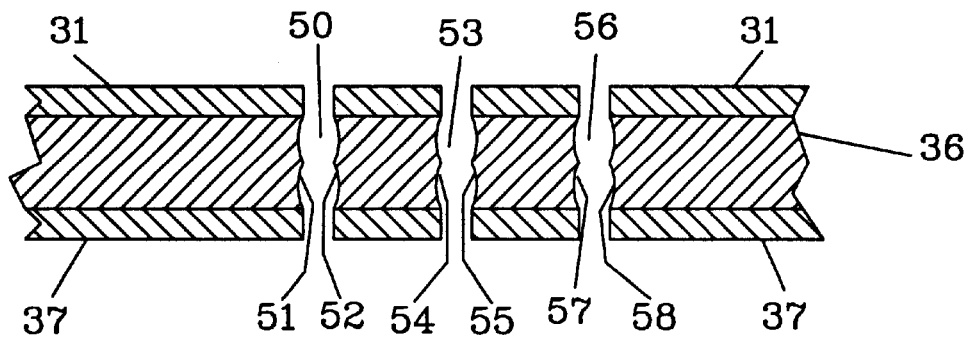

In FIG. 8, material 36 is completely etched through forming channels 50, 53 and 56. The lateral-etch in each of channels 50, 53 and 56 are the same, with the side walls 51 and 52 in channel 50, side walls 54 and 55 in channel 53, and side walls 57 and 58 in channel 56 being laterally etched the same distance. Since the figures are cross sectional views, the channel etched in openings 33d and 33e of FIG. 5 are not shown, but the etched channels will be the same as channels 50, 53 and 56.

Figure 9:
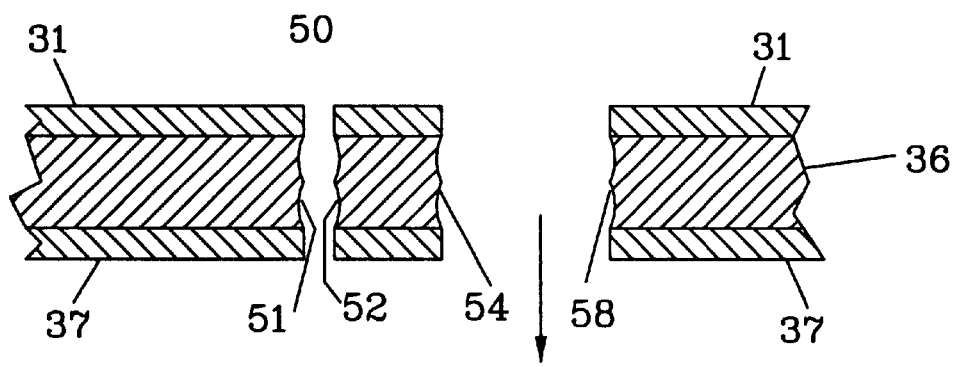
Figure 9:
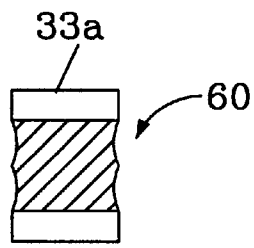

FIG. 9 shows the completed process with section 60, which was covered by photo resist 33a, and originally surrounded by openings 33b–33e, falling out, providing a larger opening than channel 50, but with the same amount of lateral etching in the sides 54 and 58 and in the sides 51 and 52 in opening 50.

The process of the invention as disclosed above shows that by designing the artwork to mask and etch areas of the same size, section can be removed by cutting them out rather than etching away all the material of the portion to be removed. The advantage is that the artwork provides the openings in which the etching is performed, can be designed with the same compensation factors throughout the entire pattern, and that the etch rate will be completely uniform for the entire pattern.

What is claimed is:

1. A method for uniformly etching, with chemical milling, fine-feature photo resist designs in a material, comprising the steps of:
    defining first linear areas to be etched with uniform width channels;
    forming uniform width channels completely around a second area to form an enclosed area, the second area wider than the uniform width channels; and
    etching through the uniform width channels to provide openings in the first linear areas, and to cause the enclosed area to drop out.

2. The method according to claim 1, wherein the uniform width channels are formed in photo resist material coating on at least one side of a material which is to be patterned by etching.

3. The method according to claim 1, wherein the uniform width channels are formed in photo resist material coating on both sides of a material which is to be patterned by etching, and the patterns on both sides of the material are aligned with each other.

4. A method for uniformly etching, with chemical milling, fine-feature photo resist designs in a material, comprising the steps of:
    defining a shape, to be produced by etching, the shape to be surrounded with a channel utilizing the narrowest width dimension that can be processed by exposure of photo resist and development of the photo resist;
    applying an etching chemical through the channel to etch through the material to cause the defined shape to drop from the material.

5. The method according to claim 4, wherein the uniform width channels are formed in photo resist material coating on at least one side of a material which is to be patterned by etching.

6. The method according to claim 4, wherein the uniform width channels are formed in photo resist material coating on both sides of a material which is to be patterned by etching, and the patterns on both sides of the material are aligned with each other.

7. An improved method for etching a metal sheet into a lead-frame that has both narrow and wide features, the method comprising
    providing a pattern to be etched, the pattern having at least one narrow feature having a first width, and at least one wide feature having a second width greater than the first width;
    forming an etch mask on the metal sheet,
        the etch mask defining the narrow feature with first opening having a third width, and
        the etch mask defining the wide feature by a second opening completely around the wide feature, the second opening having the third width;
    etching the metal sheet through the first and second openings in the etch mask, thereby etching the narrow feature and an outline of the wide feature through the metal sheet.

8. The method according to claim 7, wherein the pattern comprises additional features and the etch mask comprises openings defining the additional features.

9. The method according to claim 8, wherein the openings defining the additional features have the third width.

10. The method according to claim 7, wherein the first and second openings are formed in photo resist upon at least one side of the metal sheet.

11. The method according to claim 7, wherein the first and second openings are formed in photo resist upon both sides of the metal sheet, the openings upon opposite sides of the metal sheet aligned.

12. The method according to claim 7, wherein the first width is less than 5 mils wide.

13. The method according to claim 7, wherein the metal sheet is less than 12 mils thick.

14. The method according to claim 7, wherein the first width is less than 5 mils wide and the metal sheet is less than 12 mils thick.

15. An improved method for etching a metal sheet into a lead-frame that has both narrow and wide features, the method comprising
    providing a pattern to be etched, the pattern having at least one narrow feature having a first width, and at least one wide feature having a second width greater than the first width;
    forming an etch mask on the lead-frame blank,
        the etch mask defining the narrow feature with an first opening having a third width, and
        the etch mask defining the wide feature by a second opening completely around the wide feature, the second opening having the third width;
    etching the material through the first and second openings in the etch mask, thereby etching the narrow feature and an outline of the wide feature.

16. An improved method for etching materials into a pattern with fine-feature designs, the method comprising
    providing a pattern to be etched, the pattern having at least one narrow feature having a first width, and at least one wide feature having a second width greater than the first width;
    forming an etch mask on a material,
        the etch mask defining the narrow feature with an first opening having a third width, and the etch mask defining the wide feature by a second opening completely around the wide feature, the second opening having the third width;

etching the material through the first and second openings in the etch mask, thereby etching the narrow feature and an outline of the wide feature.

17. The method according to claim 7, wherein the first width and the third width are the same.

18. The method according to claim 15, wherein the first width and the third width are the same.

19. The method according to claim 16, wherein the first width and the third width are the same.

20. A method for uniformly etching, with chemical milling, fine-feature photo resists designs in a material, comprising the steps of:

defining linear areas to be etched with uniform width channels;

forming uniform width channels completely around an area that is to be removed; and etching through the uniform width channels to provide openings in the linear channels, and to cause the individual area with channels completely around the area to drop out.

21. The method according to claim 20, wherein the uniform width channels are formed in photo resist material coating on at least one side of a material which is to be patterned by etching.

22. The method according to claim 20, wherein the uniform width channels are formed in photo resist material coating on both sides of a material which is to be patterned by etching, and the patterns on both sides of the material are aligned with each other.

* * * * *